United States Patent
Dietz et al.

(10) Patent No.: US 7,535,225 B2
(45) Date of Patent: May 19, 2009

(54) MAGNETIC RESONANCE APPARATUS HAVING A SUPERCONDUCTING BASIC FIELD MAGNET WITH A STRUCTURALLY REINFORCED CRYOSHIELD

(75) Inventors: Peter Dietz, Fürth (DE); Andreas Krug, Fürth (DE); Mark James Le Feuvre, Littlemore (GB); Annette Lohfink, Erlangen (DE); Thorsten Speckner, Marloffstein (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/034,757

(22) Filed: Feb. 21, 2008

(65) Prior Publication Data

US 2008/0197850 A1 Aug. 21, 2008

(30) Foreign Application Priority Data

Feb. 21, 2007 (DE) ...................... 10 2007 008 513

(51) Int. Cl.
*G01V 3/00* (2006.01)
(52) U.S. Cl. ...................... 324/307; 324/309
(58) Field of Classification Search ......... 324/300–322; 310/154.01, 154.02, 154.43; 335/306, 216, 335/296, 297, 298, 301; 242/443
See application file for complete search history.

(56) References Cited

U.S. PATENT DOCUMENTS

| 4,881,035 | A | * | 11/1989 | Siebold | ...................... 324/320 |
| 6,501,275 | B1 | | 12/2002 | Westphal | |
| 6,667,619 | B2 | * | 12/2003 | Westphal et al. | ............ 324/318 |
| 6,707,302 | B2 | | 3/2004 | Ries | |
| 7,403,003 | B2 | * | 7/2008 | Kimmlingen et al. | ....... 324/307 |
| 2003/0006773 | A1 | * | 1/2003 | Ries | ........................... 324/318 |
| 2008/0265888 | A1 | * | 10/2008 | Dietz et al. | ................. 324/318 |

OTHER PUBLICATIONS

Abstract for JP2006 3050 033-A—Nov. 9, 2006.

* cited by examiner

*Primary Examiner*—Brij B Shrivastav
(74) *Attorney, Agent, or Firm*—Schiff Hardin LLP

(57) ABSTRACT

In an arrangement of a basic field magnet and a gradient coil of a magnetic resonance apparatus, the basic field magnet includes superconducting coils that are arranged in a reservoir with liquid helium for cooling. The helium reservoir is surrounded by a further reservoir, designated as an outer vacuum chamber. A vacuum exists between the outer vacuum chamber and the helium reservoir. A cryoshield is arranged between the outer vacuum chamber and the helium reservoir. The gradient coil is arranged in the inner chamber of the basic field magnet. The cryoshield has additional structure for reinforcement that counteract vibrations of the cryoshield.

7 Claims, 2 Drawing Sheets

MAGNETIC RESONANCE APPARATUS HAVING A SUPERCONDUCTING BASIC FIELD MAGNET WITH A STRUCTURALLY REINFORCED CRYOSHIELD

BACKGROUND OF THE INVENTION

1. Field of the Invention

The present invention concerns an arrangement a basic field magnet and a gradient coil of a magnetic resonance apparatus of the type wherein the basic field magnet is a superconducting magnet having a cryoshield.

2. Description of the Prior Art

In magnetic resonance apparatuses a measurement subject is exposed to a strong, constant magnetic field in order to achieve an alignment of the nuclear spins of the atoms in the measurement subject. Ordered or aligned nuclear spins can be excited to an oscillation (resonance frequency) by radiated radio-frequency energy. A radio-frequency response signal, which is acquired with an acquisition coil for later analysis, is excited via the oscillation.

Exact information about the respective origination location (spatial information) of the RF response signals is a mandatory requirement for the image reconstruction. This spatial information is produced by magnetic fields (magnetic gradient fields) along the three spatial directions in addition to the static magnetic field. The gradient fields are lower in magnitude in comparison to the main field and are formed by gradient coils.

Gradient coils for magnetic resonance apparatuses essentially include three-axis magnetic field coils. Typically a pulse-shaped current on the order of several hundreds of amperes (at electrical voltages of 2 kV) flows through each gradient coil. Due to the ohmic resistance of the coil, a considerable amount of energy is converted into heat that must be dissipated to avoid an overly severe heating of the gradient coil and of the inner chamber of the magnetic resonance apparatus in which the patient lies.

FIG. 4 shows the basic design of a central part of a typical magnetic resonance apparatus.

A basic field magnet GFM of the magnetic resonance apparatus includes primary and secondary superconducting coils SS that are arranged for cooling in a sealed reservoir BEH with liquid helium.

The helium reservoir BEH is surrounded by a further reservoir that, for example, is shaped like a kettle and is, for example, produced from stainless steel. This kettle-shaped reservoir is known as an "outer vacuum chamber" (OVC).

Vacuum predominates between the outer vacuum chamber OVC and the helium reservoir BEH. Cryoshield KRY is additionally arranged between the outer vacuum chamber OVC and the helium reservoir BEH.

In the case of an outer vacuum chamber OVC formed of electrically-conductive material, effects of gradient coil scatter fields on the cryoshield KRY are reduced due to the conductivity.

A cylindrical gradient coil GS is fixed concentrically in the inner chamber of the basic field magnet GFM by supporting elements, with the gradient coil GS being attached on a supporting tube.

In the gradient coil current rise rates on the order of 2500 kA/s are achieved by switching of currents in the gradient coil or in the gradient system.

Due to the switching, Lorentz forces that generate strong mechanical oscillations occur by interaction with the strong magnetic field of the basic field magnet. All system components coupled to the gradient system (such as, for example, housing, coverings, parts of the basic field magnet, etc.) are thereby excited to oscillate (vibrate).

Eddy currents are likewise generated by the pulsed fields of the gradient coil in conductor structures that surround the gradient coil. Due to interaction with the basic magnetic field, these eddy currents excite forces that act on the structures and likewise cause these structures to oscillate (vibrate).

Due to the oscillations, in operation of the magnetic resonance apparatus a strong airborne sound is generated that, as noise, disturbs the patient, the operating personnel and other people in proximity to the system.

Moreover, due to the vibrations of the gradient coil and of the basic field magnet as well as the transfer of the vibrations to RF acquisition antenna and patient bed, images of insufficient clinical (diagnostic) quality are obtained, that exhibit "ghosting".

An artifact known as "Epi N/2 Ghosting" occurs when forces and therewith movements in highly conductive layers are caused by magnetic fields, for example in the cryoshield. KRY Secondary eddy currents, whose field effect disrupts the imaging and that also lead to helium volatilization arise due to this movement. This is known as "helium boil-off", namely the liquid helium is elevated in temperature and vaporized by ohmic heating. Due to the volatilization it is necessary to refill a corresponding quantity of liquid helium at high cost.

SUMMARY OF THE INVENTION

An object of the present invention to provide a cost-effective arrangement that is improved with regard to the "helium boil-off" and the "Epi N/2 ghost intensity" problems.

The present invention is based on the recognition that the helium vaporization is essentially caused by oscillations or vibrations of the cylindrical cryoshield.

The inventive arrangement has a basic field magnet and gradient coil of a magnetic resonance apparatus. The basic field magnet has superconducting coils that are arranged for cooling thereof in a reservoir with liquid helium.

The helium reservoir is surrounded by a further reservoir designated as an outer vacuum chamber.

A vacuum exists between the outer vacuum chamber and the helium reservoir. A cryoshield is arranged between the outer vacuum chamber and the helium reservoir. The gradient coil is arranged in the inner chamber of the basic field magnet.

The cryoshield includes structure for reinforcement that counteract the vibrations of the cryoshield.

The vibrations of the cryoshield are thus reduced by the inventive arrangement.

A reduction of secondary eddy currents that contribute to the vibration is additionally achieved.

A complex, rigid shape is selected for the cryoshield in a first embodiment. For example, it is thus possible to apply reinforcement braces and/or reinforcement rings on the cryoshield.

In a second embodiment, the cryoshield is pre-stressed by thermal contraction. The cryoshield is, for example, thereby produced from two layers lying atop one another, the layers being respectively made of different materials. At room temperature the two layers lie atop one another and therefore exhibit an optimally similar nominal diameter.

For example, a first layer is produced from a material that exhibits a greater thermal contraction or a greater thermal contraction capability relative to the material forming a second layer. This first layer exhibits a somewhat larger radius in relation to the nominal diameter.

The second layer is produced from a material that exhibits a correspondingly lesser thermal contraction or a lesser thermal contraction capability relative to the first layer. This second layer exhibits either the nominal diameter or a smaller radius in relation to this.

If both layers are cooled—for example to an operating temperature of 50° K—due to its greater contraction capability, the first layer contracts more than the second layer, causing the first layer to be pressed firmly on the second layer. Both are thereby connected firmly with one another.

A thermally pre-stressed, more rigid cryoshield arises by the thermal contraction of the two layers.

In a third embodiment the cryoshield is fashioned as a multi-layer design. The cryoshield thereby has a very rigid layer that, due to its rigidity, counteracts the vibrations of the cryoshield and reduces these.

In a fourth embodiment the cryoshield is suspended by damping or energy-absorbing elements so that vibrations of the cryoshield are in turn reduced.

It is also possible to reduce transfers of vibrations from the inner cylinder wall of the cryoshield to the facing surfaces by, for example, implementing a mechanical impedance jump (discontinuity) in the transition.

For example, a mass block with which vibrations are reflected back is arranged at the two facing sides of the cryoshield so that an at least partial dismantling of the vibrations can ensue.

The cited measures for stabilization of the cryoshield can be applied individually or in combination with one another.

DESCRIPTION OF THE PREFERRED EMBODIMENTS

Figure 1:
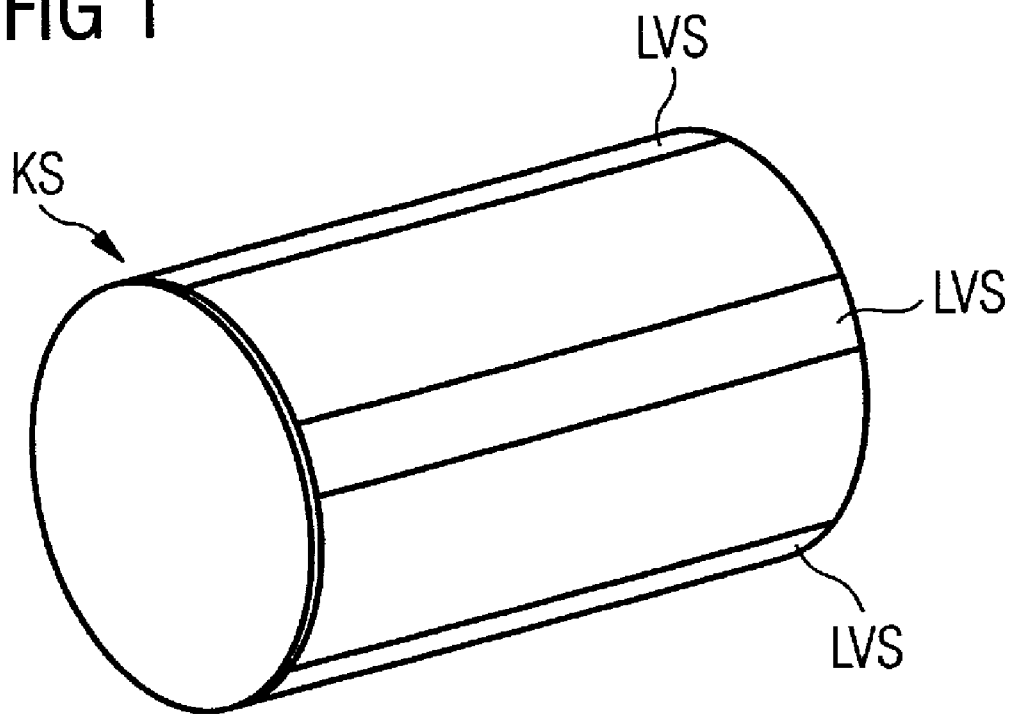
FIG. 1 illustrates an inventively designed cryoshield with longitudinal bracings.

FIG. 1 shows an inventive cryoshield KS with linearly designed longitudinal bracings LVS.

The longitudinal braces LVS are circumferentially arranged around the cylindrical cryoshield KS and, for example, run parallel to the longitudinal axis of symmetry of the cylinder.

Figure 2:
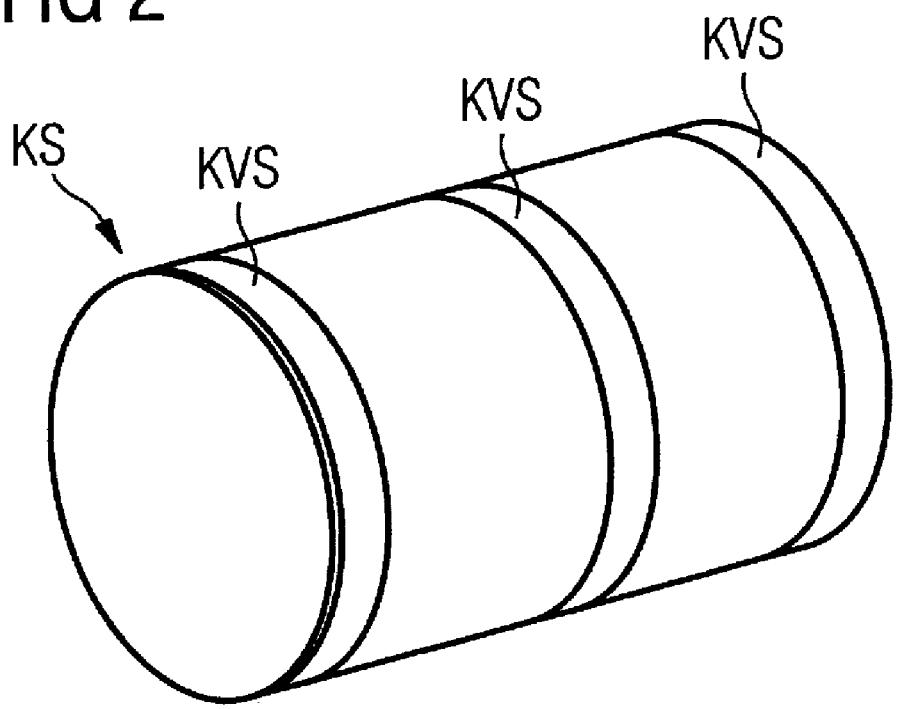
FIG. 2 illustrates an inventively designed cryoshield with transverse bracings.

FIG. 2 shows an inventive cryoshield KS with circular circumferential transverse braces KVS.

The circular transverse braces KVS are uniformly distributed as rings over the length of the cylinder.

Figure 3:
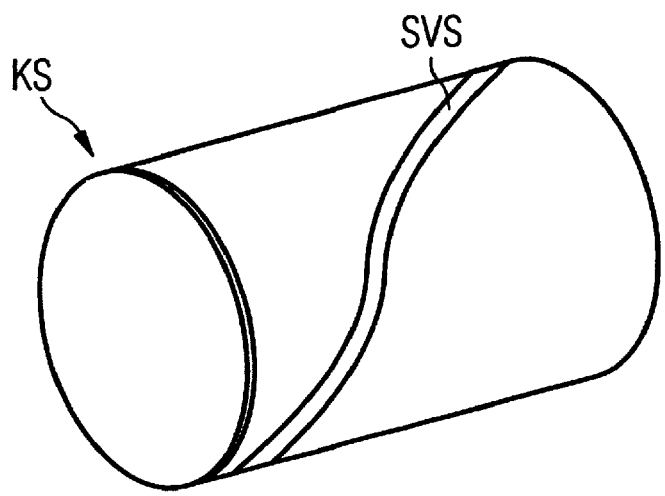
FIG. 3 illustrates an inventively designed cryoshield with a helical bracing.
Figure 4:
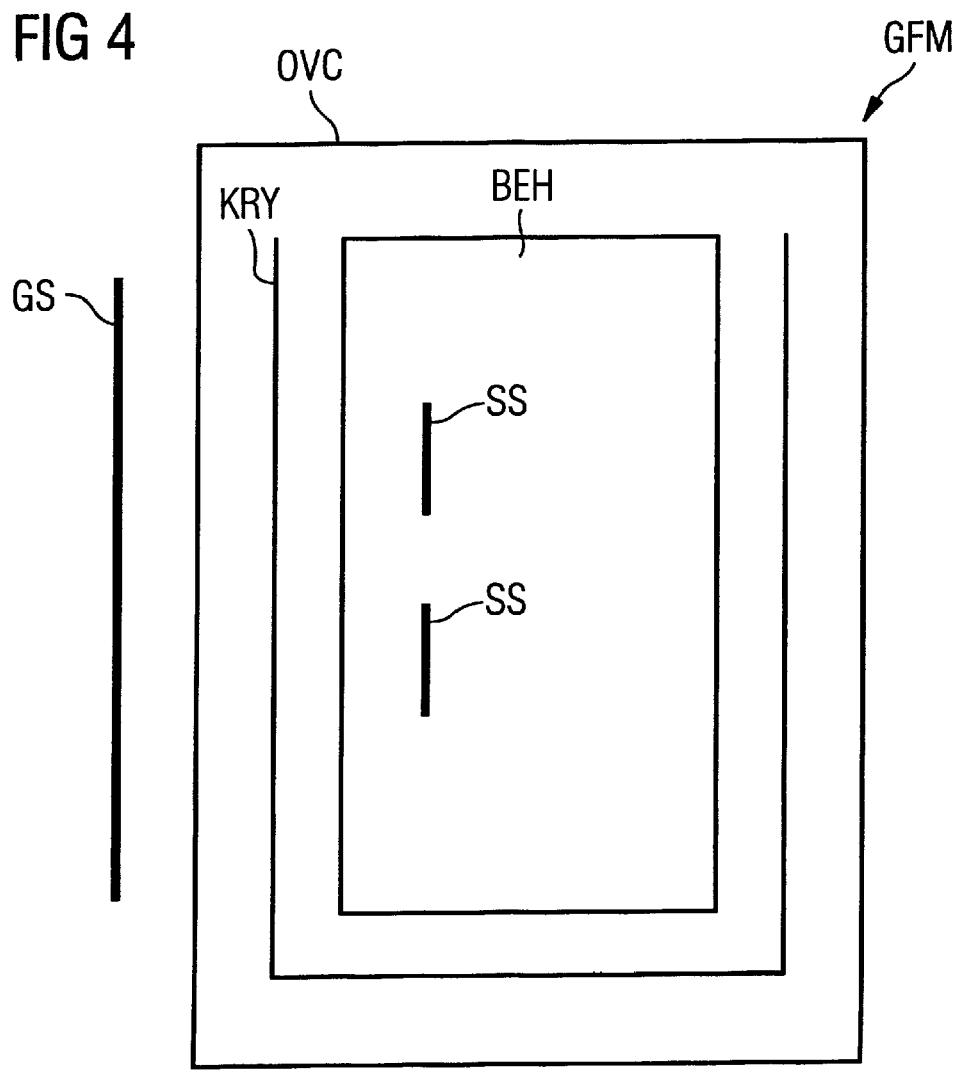
FIG. 4, as noted above, illustrates the basic design of a typical magnetic resonance apparatus according to the prior art.

FIG. 3 shows an inventive cryoshield with a helical bracing SVS running around the cylinder Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:
   a basic field magnet that generates a basic magnetic field in an examination volume, said basic field magnet comprising superconducting coils contained in a helium reservoir that is cooled by liquid helium, an outer vacuum chamber forming a reservoir that surrounds said helium reservoir with a vacuum between said outer vacuum chamber and said helium reservoir, and a cryoshield between the outer vacuum chamber and the helium reservoir, said basic field magnet defining an interior chamber in which said examination region is located;
   a gradient coil located in said interior chamber of said basic field magnet that generates a gradient magnetic field in said examination volume, operation of said gradient coil in combination with operation of said basic magnetic field producing vibrations in said cryoshield; and
   said cryoshield comprising a structural reinforcement that counteracts said vibrations.

2. An arrangement as claimed in claim 1 wherein said structural reinforcement comprises a reinforcement element selected from the group consisting of braces and rings, arranged at a periphery of said cryoshield.

3. An arrangement as claimed in claim 1 wherein said cryoshield is comprised of pre-stressed material that reinforces said cryoshield by thermal contraction of said material.

4. An arrangement as claimed in claim 1 wherein said cryoshield has a cryoshield wall formed by multiple layers of different types of material, at least one of said layers forming said structural reinforcement.

5. An arrangement as claimed in claim 1 wherein said cryoshield has a cryoshield wall comprised of multiple layers, and wherein at least one of said layers damps said vibrations.

6. An arrangement as claimed in claim 1 wherein said reinforcement structure comprises elements selected from the group consisting of damping elements and energy-absorbing elements that suspend said cryoshield between said outer vacuum chamber and said helium reservoir.

7. An arrangement as claimed in claim 1 wherein said cryoshield has an inner wall that faces other surfaces of said cryoshield, and wherein said cryoshield comprises a mass block, arranged between said inner wall and said facing surfaces, that reflects said vibrations of said inner wall back into said inner wall to dismantle said vibrations.

* * * * *